United States Patent [19]

Kang et al.

[11] Patent Number: 5,286,670

[45] Date of Patent: Feb. 15, 1994

[54] METHOD OF MANUFACTURING A SEMICONDUCTOR DEVICE HAVING BURIED ELEMENTS WITH ELECTRICAL CHARACTERISTIC

[75] Inventors: Sang-Won Kang; Hyun-Kyu Yu; Won-Gu Kang, all of Daejeon, Rep. of Korea

[73] Assignee: Korea Electronics and Telecommunications Research Institute, Rep. of Korea

[21] Appl. No.: 880,892

[22] Filed: May 8, 1992

[30] Foreign Application Priority Data

May 8, 1991 [KR] Rep. of Korea .................. 91-7454

[51] Int. Cl.⁵ .......................................... H01L 21/302
[52] U.S. Cl. ........................................ 437/61; 437/69; 437/60; 437/974; 148/DIG. 12; 148/DIG. 135
[58] Field of Search ................ 437/61, 915, 208, 40, 437/974, 919, 69, 918, 47, 60; 148/DIG. 12, DIG. 135

[56] References Cited

U.S. PATENT DOCUMENTS

| | | | |
|---|---|---|---|
| 4,980,308 | 12/1990 | Hayashi et al. | 437/915 |
| 5,091,330 | 2/1992 | Cambou et al. | 148/DIG. 12 |
| 5,100,814 | 3/1992 | Yamaguchi et al. | 437/974 |
| 5,202,273 | 4/1993 | Nakamura | 437/40 |

FOREIGN PATENT DOCUMENTS

| | | | |
|---|---|---|---|
| 0315421 | 5/1989 | European Pat. Off. | 437/40 |
| 2244375 | 11/1991 | United Kingdom | 437/61 |

*Primary Examiner*—Tom Thomas
*Assistant Examiner*—Michael Trinh
*Attorney, Agent, or Firm*—Evenson, McKeown, Edwards & Lenahan

[57] ABSTRACT

There are disclosed a semiconductor device having electrical elements buried a SOI substrate and a manufacturing method thereof, the manufacturing method of the invention comprising the steps of: (a) forming a first isolating insulator layer at a seed wafer by using an isolation mask, depositing a second isolating insulator layer overlying the first isolating insulator layer and the seed wafer, and defining contact holes by using a contact mask to form contacts on the seed wafer; (b) depositing a first polysilicon layer on the second isolating insulator layer and the contacts and doping an impurity into the first polysilicon layer; (c) patterning the first polysilicon layer to define an electrical element, depositing an insulating layer around the electrical element, and forming a second polysilicon layer overlying the second isolating insulator layer and the insulating layer; (d) doping an impurity into the second polysilicon layer for connecting with a handling wafer, and polishing the second polysilicon layer thus doped to form a mirror surface; (e) depositing an insulating layer for connection on the handling wafer, and performing a thermal process to bond the handling wafer and the mirror surface through the insulating layer for connection; and (f) polishing the seed wafer until the first isolating insulator layer as a polishing stopper is exposed, to form the SOI substrate having an active region where a device is formed, by the invention the efficiency of chip area can be promoted.

8 Claims, 5 Drawing Sheets

METHOD OF MANUFACTURING A SEMICONDUCTOR DEVICE HAVING BURIED ELEMENTS WITH ELECTRICAL CHARACTERISTIC

BACKGROUND OF THE INVENTION

1. Field of the Invention

The present invention relates to a semiconductor device having buried elements with element with electrical and a manufacturing method thereof, and more particularly to a SOI (Silicon On Insulator) substrate in which electrical elements such as capacitor, resistor, connecting line or the like are previously buried on any wafer and are bonded with other wafer, a manufacturing method the SOI substrate having buried elements.

2. Description of the Prior Art

As shown in FIG. 1A to 1C, a prior art SDB (Silicon Director Bonding) process is disclosed in which a seed wafer and a handling wafer are bonded from each other to form a SOI substrate.

FIG. 1A are cross-sectional views showing the two wafers around which oxide films are deposited respectively.

In FIG. 1A, the oxide films 2 and 4 having about 5000 Å are deposited around the seed wafer 1 and the handling wafer 3, respectively, subsequently, the seed wafer 1 and handling wafer 3 thus deposited is subjected to a well-known bonding process to bond the two wafers. The bonding process is carried out in a typical manner; for example, maintaining the seed wafer 1 in contact with the handling wafer 3 at about 800° C. under supply of voltage pulse (about 100-500 V).

In addition, a substrate 5 in which the two wafers are contacted is subjected to a thermal process in order to raise the adhesive strength of the two wafers. The thermal process is carried out in a typical manner; for example, maintaining the substrate 5 thus contacted at 900°-1100° C. in a nitrogen atmosphere or an oxygen atmosphere for about 30 min (as shown in FIG. 1B). With respect to FIG. 1B, reference number 6 is a contact portion of the oxide films between the two wafers. Through the thermal process, the substrate thus formed is more than 100 Kg/cm² in the adhesive strength.

FIG. 1C shows a SOI substrate polished by a well-known polishing process. In FIG. 1C, the seed wafer 1 is polished into planarization by means of a mechanical or chemical polishing process in order to form a SOI substrate 7 in which the seed wafer thus polished is isolated from the handling wafer 3 by the contact portion 6 formed as thick as about 1 μm.

Such a prior art as described above is disclosed in European Patent 274801 to Alexander, et al.

As shown in FIG. 2A to 2D, another prior art P-SDB (poly-crystalline to Silicon Direct Bonding) process is disclosed. In FIG. 2A, firstly, on the seed wafer 17 is formed a mesa pattern 10 having about 1000 Å in thickness, and then after forming an oxide layer 11 of 1 m in thickness on the seed wafer 17 provided with the mesa pattern 10 a polysilicon layer 12 having 5 μm in thickness is deposited on the oxide layer 11. The mesa pattern 10 means a rugged shape in which concave portions are spaced in matrix on the surface of the seed wafer.

FIG. 2B shows a wafer polished by a polishing process. With respect to FIG. 2B, the polysilicon layer 12 on the seed wafer 17 is polished into planarization to remove rugged portions in the surface of the polysilicon layer 12 and to form a mirror surface 13 on the polysilicon layer.

In turn, an oxide layer for connection is formed on the surface of a handling wafer 16, respectively, and then the mirror surface 13 of the polysilicon layer is bonded with the handling wafer 16 through the oxide layer 15 by means of a P-SDB process similar to the above-mentioned SDB process, as shown in FIG. 2C.

FIG. 2D shows a SOI substrate formed by the well-known polishing process for planarization of the seed wafer. FIG. 2D, the polishing process of the seed wafer 16 is carried out in succession until the upper surface of the oxide layer 11 is exposed. Then, the oxide layer 11 serves as a polishing stopper so that thickness of a SOI 14 thus formed may be controlled by depth of the concave portion in the mesa pattern 10 of the seed wafer 17.

As described above, since the polysilicon layer 12 in the prior art P-SDB process is used for preventing occurrence of the rugged portions caused by the mesa pattern 10 of the seed wafer 17, and is polished into planarization of a bonding interface on the seed wafer, and therefore it is easy to bond the seed wafer and the handling wafer.

However, in the prior arts for manufacturing a SOI substrate in which a seed wafer is bonded with a handling wafer before formation of electrical element on a seed wafer, since after bonding the two wafers electrical elements is formed in the seed wafer of the SOI substrate, the SOI substrate thus manufactured is lowered in efficiency of chip area.

SUMMARY OF THE INVENTION

It is, therefore, an object of the present invention to provide a semiconductor device having buried elements with electrical characteristic and a manufacturing method thereof in which before bonding of a seed wafer and a handling wafer a plurality of conductive layers or a plurality of resistive layers are formed on a seed wafer to form at least one of electrical elements such as capacitor, resistor, interconnector or the like, and the seed wafer thus formed is bonded with the handling wafer to manufacture a SOI substrate having the electrical elements buried between the two wafers, so that the SOI substrate can be promoted in efficiency of chip area and in several constructions.

According to an aspect of the present invention, there is provided with a method for manufacturing a semiconductor device having buried elements with electrical characteristic in a SOI substrate comprising the steps of:

(a) forming a first isolating insulator layer at a seed wafer by using an isolation mask, depositing a second isolating insulator layer overlying the first isolating insulator layer and the seed wafer, and defining contact holes by using a contact mask to form contacts on the seed wafer;

(b) depositing a first polysilicon layer on the second isolating insulator layer and the contacts and doping an impurity into the first polysilicon layer;

(c) patterning the first polysilicon layer to define an electrical element, depositing an insulating layer around the electrical element, and forming a second polysilicon layer overlying the second isolating insulator layer and the insulating layer;

(d) doping an impurity into the second polysilicon layer for connecting with a handling wafer, and polishing the second polysilicon layer thus doped to form a mirror surface;

(e) depositing an insulating layer for connection on the handling wafer, and performing a thermal process to bond the handling wafer and the mirror surface through the insulating layer for connection; and (f) polishing the seed wafer until the first isolating insulator layer as a polishing stopper is exposed, to form the SOI substrate having an active region where a device is formed.

In aforesaid the method, the electrical element is formed vertically under the active region of the seed wafer. The first isolating insulator layer is formed between the active regions of the SOI substrate, wherein the second isolating insulator layer is formed between the active region and the electrical element, wherein the insulating layer is formed between the electrical element and the second polysilicon layer, and wherein the insulating layer for connection is formed between the second polysilicon layer and the handling wafer, whereby the active region and the electrical element are vertically located for electrical isolation from each other, and the second polysilicon layer and the handling wafer are vertically located for electrical isolating from each other.

Also, the insulating layer between the electrical element and the second polysilicon is used as a capacitor dielectric layer, a first contact between the active region and the electrical element is used as a substrate contact, a second contact on the active region is used as a node contact, and a third contact on the second polysilicon layer is used as a plate contact, whereby the electrical element buried in the SOI substrate serves as a capacitor. The electrical element serves as a resistive line for electrical connecting devices.

In the method, the electrical element serves as an interconnector for electrical connecting devices to be formed in the active regions. The first polysilicon layer is for one of a refractory metal, polycide, and silicide. The plurality of laminated construction composed of the resistive line and the interconnector are formed in the SOI substrate.

According to other aspect of the present invention, there is provided with a semiconductor device having buried elements with electrical characteristic comprising:

an electrical element formed on a seed wafer by using either a conductive layer or a resistive layer;

a polysilicon layer deposited on the electrical element and provided with a mirror surface by polishing;

a handling wafer to be in contact with the seed wafer; and an insulating layer for bonding the mirror surface and the handling wafer by a thermal process.

In the aforesaid device, the mirror surface and the handling wafer is directly bonded without formation of the insulating layer, whereby electrical potential is applied from the handling wafer.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENT(s)

Figure 1A:
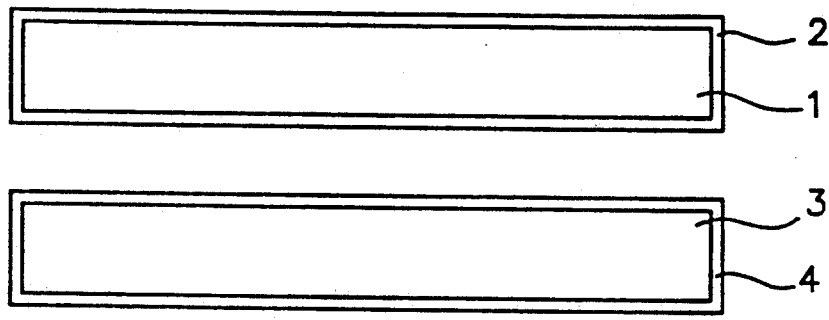
FIGS. 1A to 1C are cross-sectional views showing a prior art bonding process of silicon-silicon wafers.
Figure 1B:
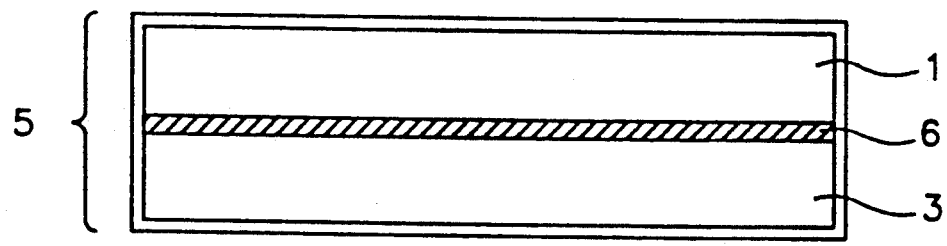
Figure 1C:
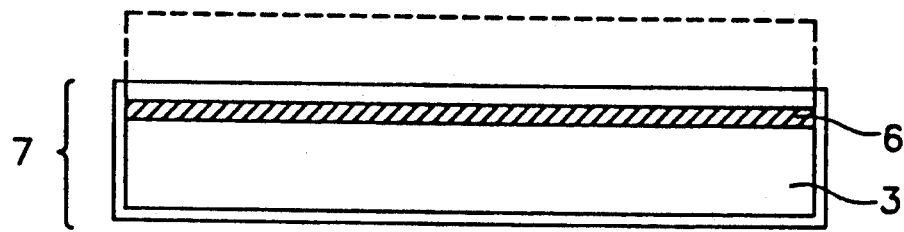
Figure 2A:
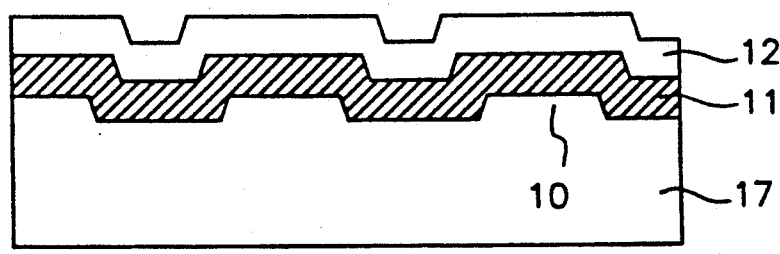
FIGS. 2A to 2D are cross-sectional views showing another prior art bonding process of polysilicon-silicon wafers.
Figure 2B:
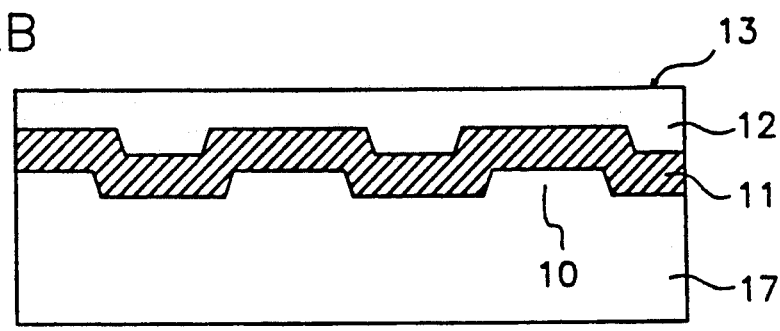
Figure 2C:
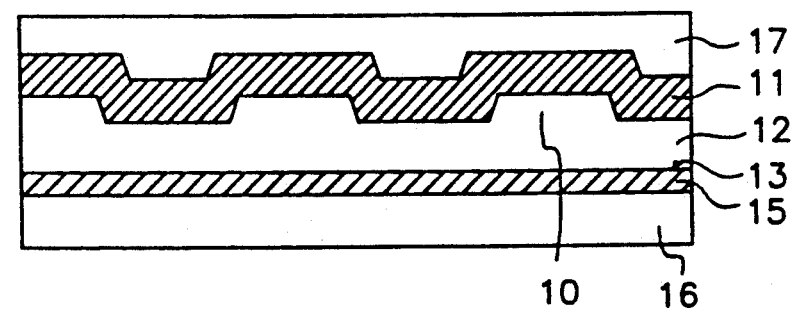
Figure 2D:
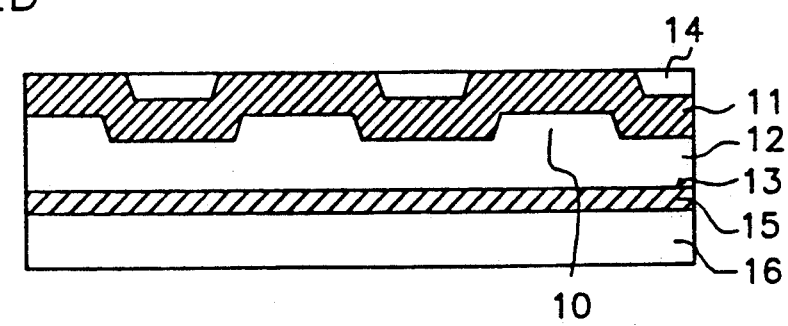
Figure 3A:
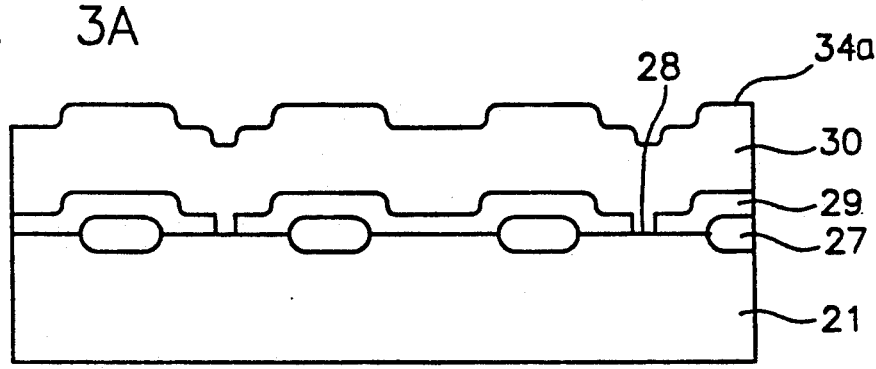
FIGS. 3A to 3D are cross-sectional views showing the bonding process of polysilicon-silicon wafer according to the present invention.

Referring to FIG. 3A, a first isolating insulator layer 27 is deposited at a seed wafer 21, having a predetermined thickness. A second isolating insulator layer 29 is formed on the first isolating insulator layer 27 and the seed wafer 21, and then portions of the second isolating insulator layer 29 are etched away by using a contact mask to form contact holes 28 on the seed wafer 21.

Subsequently, a first polysilicon layer 30 is deposited on the insulator layer 20, filling the contact holes 28, and then the first polysilicon layer 30 is doped with an N-type impurity or a P-type impurity.

In the formation of the first polysilicon layer 30, thickness of a SOI to be formed is identical with depth of the first isolating insulator layer 27 which is sunk into the seed wafer 21, and therefore the thickness of the first isolating insulator layer 27 has to be adjusted carefully.

In addition, thickness of the first polysilicon layer 30 can be determined in accordance with electrical characteristic of a buried element to be formed in a SOI substrate. If a buried element in the SOI substrate is an interconnector, the first polysilicon layer can be composed of a refractory metal, a polycide layer or a silicide layer.

Figure 3B:
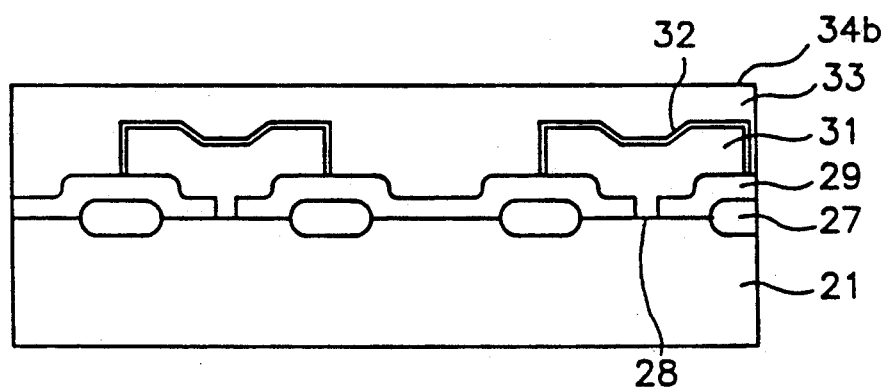

FIG. 3B is a diagram showing a process for fabricating an electrical element. In FIG. 3B, the first polysilicon layer 30 is patterned by an element mask to define an electrical element, and all other portions except the defined portion 31 are removed. In turn, an insulating layer 32 is deposited entirely on the portion 31, and then a second polysilicon layer 33 for planarization of the SOI substrate is formed overlying the insulating layer 32 and the remaining portions of the insulator layer 29.

In addition, the second polysilicon layer 33 is doped with an N-type impurity or a P type impurity in accordance with a device to be formed. After deposition of the second polysilicon layer 33, by using a polishing process the polysilicon layer 33 has a mirror surface 34b. Also, in the same manner described above, the second polysilicon layer 33 can be substituted for other materials in accordance with applications.

Figure 3C:
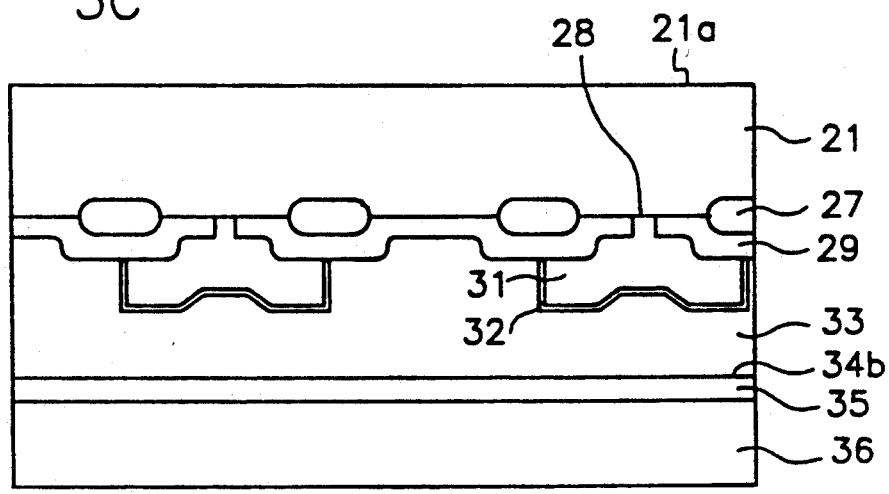

With respect to FIG. 3C, an insulating layer 35 for connection is deposited on a handling wafer 36 to be in contact with the mirror surface 34b of the second polysilicon layer 33, and then the handling wafer 30 in contact with the mirror surface 34b through the insulating layer 35 is subjected to the well-known thermal process.

By the thermal process, the two wafer 21 and 30 are bonded from each other through the insulating layer 35. The insulating layer 35 serves as electrically isolating portion between the handling wafer 36 and the second polysilicon layer 33 of the seed wafer 21.

On the other hand, the process for forming the insulating layer 35 may be omitted, and therefore the handling wafer can be connected directly to the second polysilicon layer 33. Accordingly, electrical potential to be applied to the second polysilicon layer 33 can be supplied directly from the handling wafer.

Figure 3D:
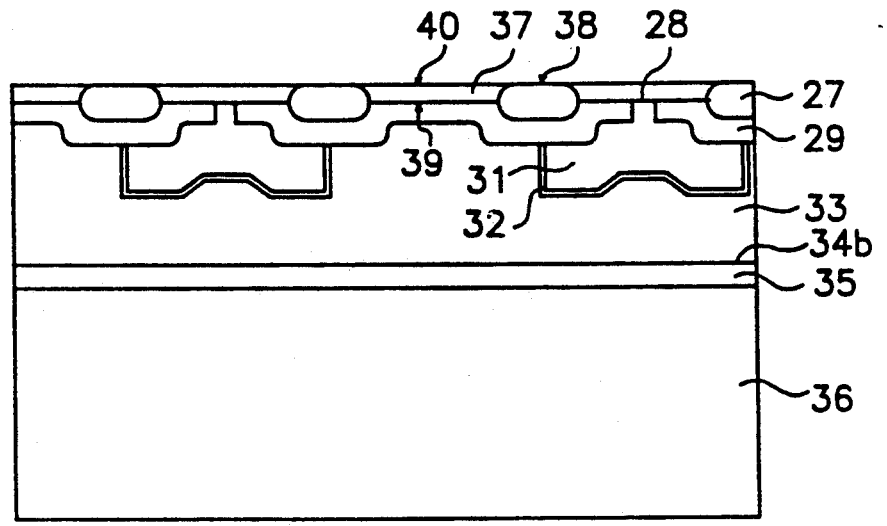

After bonding of the two wafers, the seed wafer 21 is polished by a mechanical process or a chemical process in succession until the upper surface of the first isolating insulator layer 27 as a polishing stopper is exposed, as shown in FIG. 3D. Accordingly, a SOI substrate can be manufactured having silicon film similar to depth of the seed wafer into which the first isolating insulator layer 27 is sunk.

FIG. 3D shows a cross-sectional view of a SOI substrate into which an electrical element is buried. In FIG. 3D, reference numeral 39 is the surface of the seed wafer, however, by polishing of the above-mentioned SDB process and the well-known polishing process in the art reference numeral 40 becomes the surface of the seed wafer in which an active element is formed.

Comparing the SOI substrate manufactured by the present invention to that of the prior art, the SOI substrate according to the invention can house many more chips in the same area.

Figure 4A:
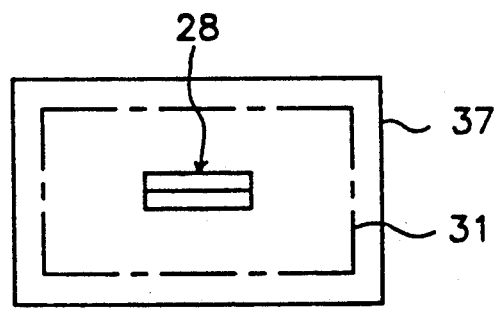
FIGS. 4A to 4B are plane view and cross-sectional view of the semiconductor device in which electrical elements are effectively buried in the polysilicon-silicon wafers manufactured by the present invention, respectively.

FIG. 4A shows arrangement of an electrical element according to the present invention. In FIG. 4A, an electrical element 31 and a contact hole 48 are piled up on an active region 37 of the SOI substrate. The contact hole 28 serves as a connector for electrically connecting the active region 37.

Figure 4B:
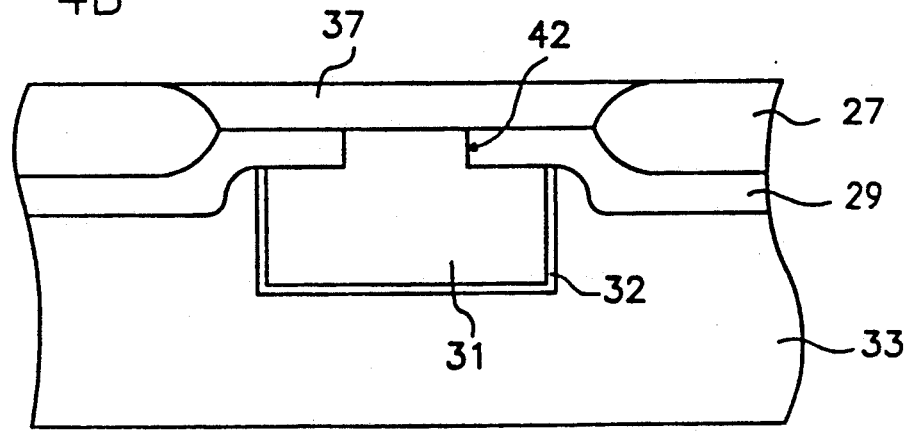

FIG. 4B is the cross-sectional view of the semiconductor device shown in FIG. 4A. In FIG. 4B, the active region 37 is vertically connected to the electrical element 31 through the contact hole 42. The active regions 37 are isolated from each other by the first isolating insulator layer 27.

In addition, the element 31 thus buried in the SOI substrate is electrically isolated by the insulating layer 32. As shown in FIG. 4A and 4B, since the SOI substrate of the present invention can house at least one of the electrical elements such as capacitor, resistor, interconnector or the like, and has a vertical construction of the active region 37 and the buried element 31, the SOI substrate can be promoted in efficiency of chip area, therefore obtaining three-dimensional integrated circuit.

Figure 5:
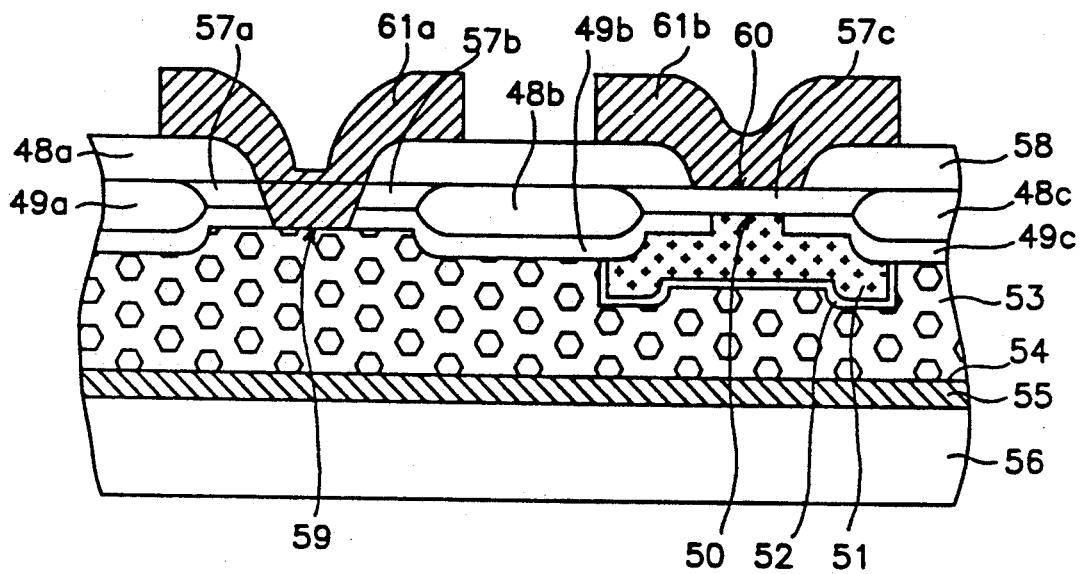
FIG. 5 is a cross-sectional view of the semiconductor device in which a capacitor as electrical element is buried in the SOI substrate in accordance with the present invention.

FIG. 5 shows the cross-sectional view of the semiconductor device in which an electrical element as capacitor is buried in a SOI substrate in accordance with an embodiment of the present invention. In FIG. 5, a charge storing electrode 51 is connected vertically to an active region 67 through a substrate contact 5D, and is isolated electrically to a plate electrode 53 of a capacitor by an dielectric layer 52 of the capacitor.

The charge storing electrode 51 corresponds to the electric element 31 of FIG. 3D, the active region 57 corresponds to the region 37 of FIG. 3D, the substrate contact 50 corresponds to the contact 28 of FIG. 3D, the plate electrode 53 corresponds to the second polysilicon layer 33 of FIG. 3D, and the dielectric layer 52 corresponds to the insulating layer 32 of FIG. 3D.

The method for manufacturing the above-mentioned semiconductor device in which a capacitor is buried in a SOI substrate will be described with reference to FIG. 5.

First, for electrical isolation among the active region 57a, 57b, 57c of the seed wafer, a first isolating insulator layer 48a, 48b, 48c is formed by LOCOS (local oxidation of silicon) as well-known. In order to make a SOI substrate, a second isolating insulator layer 49a, 49b, 49c is deposited on the first isolating insulator layer and the seed wafer, and is patterned by a contact mask to define the substrate contact 50.

Subsequently, for forming the charge storing electrode 51 a polysilicon layer is deposited on the second isolating insulator layer thus patterned, filling the substrate contact 50, and then around the charge storing electrode 51 thus formed is deposited an insulating layer as the capacitor dielectric layer 52. In turn, a polysilicon layer for the plate electrode 53 is deposited on the capacitor electrode 52 and the second isolating insulator layer.

Also, after polishing the plate electrode 53 to form a mirror surface 54 thereon, by any of the well-known thermal process the mirror surface 54 is bonded in contact with a handling wafer 56 through a insulating layer 55 for connection.

The two wafers thus bonded is subjected to any of the well-known polishing process; performing thinning of the seed wafer until the upper surface of the first isolating insulator layer is exposed. Then, remaining portions of the seed wafer are the active region.

After formation of the active region, on the active region 57c is formed the node contact 60 and on the plate electrode 53 is formed the plate contact 59. In addition, using a metal layer a plate metal-electrode 61a and a node metal-electrode 61b are formed. According to the embodiment of the present invention, the capacitor element buried in the SOI substrate can be obtained.

By a modification of the above-described embodiment of the invention, since the seed wafer and the handling wafer can be bonded without the connecting insulator therebetween, bias voltage can be applied directly from the handle wafer.

Moreover, the charge storing electrode 51 can be connected directly to the active region 57c, to be provided with a semiconductor device (for example, MOSFET or Bipolar transistor), through the substrate contact 50.

In the embodiment of the invention, a buried stack capacitor which is composed of a polysilicon layer having several thousand angstrom in thickness has be described as an example, however, a buried trench capacitor cab be manufactured by the same process as described in the embodiment of the invention.

Figure 6:
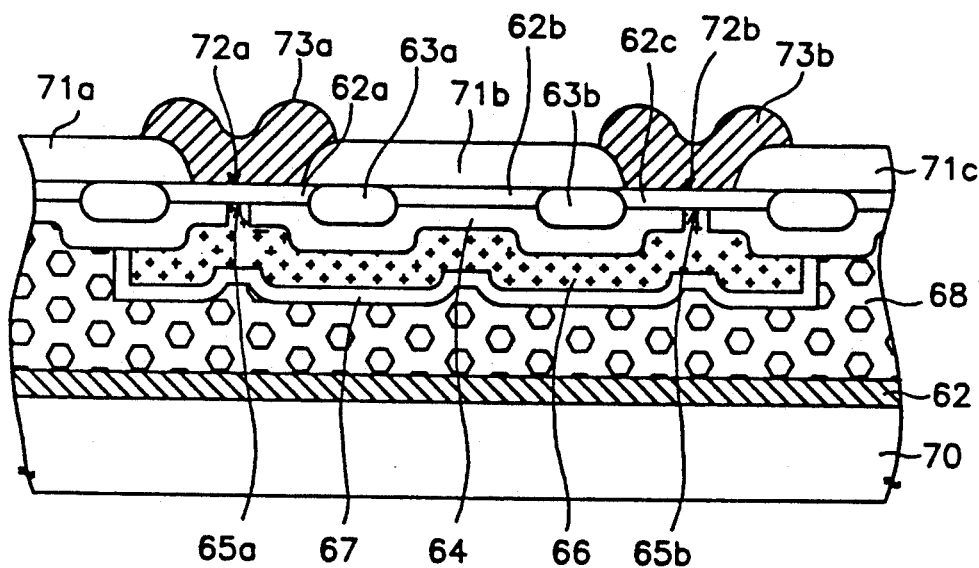
FIG. 6 is a cross-sectional view of the semiconductor device in which an interconnection or a resistor as electrical element is buried in the SOI substrate in accordance with the present invention.

FIG. 6 shows the cross-sectional view of the semiconductor device in which an electrical element as interconnector or resistor is buried in a SOI substrate in accordance with another embodiment of the present invention.

In FIG. 6, active regions 62a, 62b, 62c are electrically isolated by first isolating insulator layer 63a, 63b, 63c. In order to connect electrically between the active region 82a and 82c, a first polysilicon layer 68 doped with an impurity is buried in a SOI substrate.

The first polysilicon layer 66 which is electrically isolated with the active regions by a second isolating insulator layer 64 is used as interconnector or resistor. Also, the polysilicon layer 68 is connected through substrate contacts 65a and 65b to devices to be formed in the active region.

The first polysilicon layer 66 is patterned by using an interconnector mask or a resistor mask to define interconnector or resistor, and then a third isolating insulator layer 67 and a second polysilicon layer 68 are sequentially deposited on the first polysilicon layer 66.

After polishing the second polysilicon layer 68 to form a mirror surface thereof, the mirror surface is bonded with a handling wafer 70 on which an insulating layer 69 for connection is deposited. However, without the formation of the insulating layer for connection, the mirror surface of the second polysilicon layer 68 is bonded with the handling wafer 70 so that back bias voltage can be applied directly to the first polysilicon layer 66 through the handling wafer.

The two wafer thus bonded is subjected to the well-known polishing process; performing thinning of the seed wafer until the upper surface of the first isolating insulator layer is exposed. Then a buried element composed of the first polysilicon layer 66 serves as interconnector, or resistor.

According to the above-described embodiment of the present invention, the first polysilicon layer 66 can be connected directly to semiconductor devices such as MOSFET or bipolar transistor to be formed in the active regions.

In the embodiment of the invention, the buried element composed of polysilicon may be for polycide or silicide, whereby to reduce resistance of interconnector.

As understood in the embodiments of the present invention, a seed wafer is provided with at lease one of electrical elements such as capacitor, interconnector, resistor or the like, using a conductive or insulating layer, and then the seed wafer having the elements is bonded with a handling wafer, thereby obtaining a SOI substrate in which the elements are buried.

Accordingly, the semiconductor device of the present invention can be promoted in efficiency of a chip area, and particularly memory cell can be manufactured easily in small chip area in case that a buried element is capacitor.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A method for manufacturing a semiconductor device having buried elements with electrical characteristic in a SOI substrate comprising the steps of:
    (a) forming a first isolating insulator layer at a seed wafer by using an isolation mask, depositing a second isolating insulator layer overlying the first isolating insulator layer and the seed wafer, and defining contact holes by using a contact mask to form contacts on the seed wafer;
    (b) depositing a first polysilicon layer on the second isolating insulator layer and the contacts and doping an impurity into the first polysilicon layer;
    (c) patterning the first polysilicon layer to define an electrical element, depositing an insulating layer around the electrical element, and forming a second polysilicon layer overlying the second isolating insulator layer and the insulating layer;
    (d) doping an impurity into the second polysilicon layer for connecting with a handling wafer, and polishing the second polysilicon layer thus doped to form a mirror surface;
    (e) depositing an insulating layer for connection on the handling wafer, and performing a thermal process to bond the handling wafer and the mirror surface through the insulating layer for connection; and
    (f) polishing the seed wafer until the first isolating insulator layer as a polishing stopper is exposed, to form the SOI substrate having an active region where a device is formed.

2. The method according to claim 1 wherein the electrical element is formed vertically under the active region of the seed wafer.

3. The method according to claim 1 wherein the first isolating insulator layer is formed between the active regions of the SOI substrate, wherein the Second isolating insulator layer is formed between the active region and the electrical element, wherein the insulating layer is formed between the electrical element and the second polysilicon layer, and wherein the insulating layer for connection is formed between the second polysilicon layer and the handling wafer, whereby the active region and the electrical element are vertically located for electrical isolation from each other, and the second polysilicon layer and the handling wafer are vertically located for electrical isolating from each other.

4. The method according to claim 1 wherein the insulating layer between the electrical element and the second polysilicon is used as a capacitor dielectric layer, a first contact between the active region and the electrical element is used as a substrate contact, a second contact on the active region is used as a node contact, and a third contact on the second polysilicon layer is used as a plate contact, whereby the electrical element buried in the SOI substrate serves as a capacitor.

5. The method according to claim 1 wherein the electrical element serves as a resistive line for electrical connecting devices.

6. The method according to claim 1 wherein the electrical element serves as an interconnector for electrical connecting devices to be formed in the active regions.

7. The method according to claim 1 wherein the first polysilicon layer is for one of a refractory metal, polycide, and Silicide.

8. The method according to claim 6 wherein a plurality of laminated construction composed of the resistive line and the interconnector are formed in the SOI substrate.

* * * * *